(12) United States Patent
Chidambarrao et al.

(10) Patent No.: US 7,888,197 B2
(45) Date of Patent: *Feb. 15, 2011

(54) METHOD OF FORMING STRESSED SOI FET HAVING DOPED GLASS BOX LAYER USING SACRIFICIAL STRESSED LAYER

(75) Inventors: Dureseti Chidambarrao, Weston, CT (US); William K. Henson, Peekskill, NY (US); Yaocheng Liu, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 205 days.

This patent is subject to a terminal disclaimer.

(21) Appl. No.: 11/622,056

(22) Filed: Jan. 11, 2007

(65) Prior Publication Data

US 2008/0169508 A1 Jul. 17, 2008

(51) Int. Cl.
*H01L 21/8238* (2006.01)

(52) U.S. Cl. .................. 438/221; 438/199; 438/219; 438/222; 438/424; 438/459; 257/E21.564

(58) Field of Classification Search .......... 438/154, 438/164, 199, 221, 225, 275, 294–297, 404–406, 438/412, 425, 438, 479, 149, 153, 219, 424, 438/761, 763, 455, 459, 222, 429; 257/347, 257/351, E27.06, E27.112, E21.545–E21.546, 257/E21.564, E21.632, 350, 353, 354, E21.561, 257/E21.618, E21.628, E21.633, E21.642

See application file for complete search history.

(56) References Cited

U.S. PATENT DOCUMENTS 4,771,016 A * 9/1988 Bajor et al. ............... 438/455

(Continued)

FOREIGN PATENT DOCUMENTS

JP 05160089 A * 6/1993

OTHER PUBLICATIONS

U.S. Appl. No. 11/548,428, entitled "Method of Reducing Stacking Faults Through Annealing", of Yun-Yu Wang et al., filed Oct. 11, 2006.

*Primary Examiner*—Matthew C Landau
*Assistant Examiner*—Joseph C Nicely
(74) *Attorney, Agent, or Firm*—H. Daniel Schnurmann; Daryl K. Neff

(57) ABSTRACT

A method is provided for fabricating a semiconductor-on-insulator ("SOI") substrate. In such method an SOI substrate is formed to include (i) an SOI layer of monocrystalline silicon separated from (ii) a bulk semiconductor layer by (iii) a buried oxide ("BOX") layer including a layer of doped silicate glass. A sacrificial stressed layer is deposited onto the SOI substrate to overlie the SOI layer. Trenches are then etched through the sacrificial stressed layer and into the SOI layer. The SOI substrate is heated with the sacrificial stressed layer sufficiently to cause the glass layer to soften and the sacrificial stressed layer to relax, to thereby apply a stress to the SOI layer to form a stressed SOI layer. The trenches in the stressed SOI layer are then filled with a dielectric material to form trench isolation regions contacting peripheral edges of the stressed SOI layer, the trench isolation regions extending downwardly from a major surface of the stressed SOI layer towards the BOX layer. The sacrificial stressed layer is then removed to expose the stressed SOI layer. Field effect transistors can then be formed in the stressed SOI layer.

18 Claims, 15 Drawing Sheets

U.S. PATENT DOCUMENTS

| | | | | |
|---|---|---|---|---|
| 5,152,834 A | * | 10/1992 | Allman | 106/287.13 |
| 5,543,648 A | * | 8/1996 | Miyawaki | 257/347 |
| 6,214,702 B1 | * | 4/2001 | Kim | 438/459 |
| 6,218,289 B1 | * | 4/2001 | Wu | 438/632 |
| 6,225,154 B1 | * | 5/2001 | Allman | 438/231 |
| 6,878,611 B2 | * | 4/2005 | Sadana et al. | 438/479 |
| 6,991,998 B2 | * | 1/2006 | Bedell et al. | 438/479 |
| 7,125,759 B2 | * | 10/2006 | Chen et al. | 438/154 |
| 7,202,513 B1 | * | 4/2007 | Chidambarrao et al. | 257/190 |
| 7,223,994 B2 | * | 5/2007 | Chidambarrao et al. | 257/18 |
| 7,384,829 B2 | * | 6/2008 | Cheng et al. | 438/153 |
| 7,416,965 B2 | * | 8/2008 | Mantl et al. | 438/479 |
| 7,449,379 B2 | * | 11/2008 | Ochimizu et al. | 438/199 |
| 7,482,252 B1 | * | 1/2009 | Wu et al. | 438/479 |
| 7,632,724 B2 | * | 12/2009 | Chidambarrao et al. | 438/153 |
| 2002/0140031 A1 | * | 10/2002 | Rim | 257/347 |
| 2003/0003708 A1 | * | 1/2003 | Ireland | 438/622 |
| 2004/0094763 A1 | * | 5/2004 | Agnello et al. | 257/55 |
| 2004/0194812 A1 | * | 10/2004 | Matsuno et al. | 134/27 |
| 2004/0262784 A1 | * | 12/2004 | Doris et al. | 257/900 |
| 2005/0054175 A1 | * | 3/2005 | Bauer | 438/404 |
| 2005/0064646 A1 | * | 3/2005 | Chidambarrao et al. | 438/221 |
| 2005/0079449 A1 | * | 4/2005 | Kwon et al. | 430/311 |
| 2005/0104131 A1 | * | 5/2005 | Chidambarrao et al. | 257/369 |
| 2005/0269561 A1 | * | 12/2005 | Chidambarrao et al. | 257/19 |
| 2006/0001089 A1 | * | 1/2006 | Bedell et al. | 257/347 |
| 2006/0068545 A1 | * | 3/2006 | Goldbach | 438/256 |
| 2006/0125008 A1 | * | 6/2006 | Chidambarrao et al. | 257/347 |
| 2006/0128117 A1 | * | 6/2006 | Ghyselen et al. | 438/455 |
| 2006/0214232 A1 | * | 9/2006 | Chen et al. | 257/351 |
| 2007/0059875 A1 | * | 3/2007 | Mishima | 438/199 |
| 2007/0069294 A1 | * | 3/2007 | Chidambarrao et al. | 257/351 |
| 2007/0087525 A1 | * | 4/2007 | Chen et al. | 438/429 |
| 2007/0096195 A1 | * | 5/2007 | Hoentschel et al. | 257/315 |
| 2007/0122965 A1 | * | 5/2007 | Chidambarrao et al. | 438/219 |
| 2007/0158753 A1 | * | 7/2007 | Arnold et al. | 257/369 |
| 2007/0235807 A1 | * | 10/2007 | White et al. | 257/351 |
| 2007/0238233 A1 | * | 10/2007 | Sadaka et al. | 438/187 |
| 2007/0269963 A1 | * | 11/2007 | Cheng et al. | 438/479 |
| 2007/0278574 A1 | * | 12/2007 | Hsu et al. | 257/347 |
| 2008/0135875 A1 | * | 6/2008 | Agnello et al. | 257/190 |
| 2008/0191281 A1 | * | 8/2008 | Chidambarrao et al. | 257/351 |
| 2008/0237709 A1 | * | 10/2008 | Chidambarrao et al. | 257/347 |
| 2008/0303091 A1 | * | 12/2008 | Shimizu et al. | 257/351 |

* cited by examiner

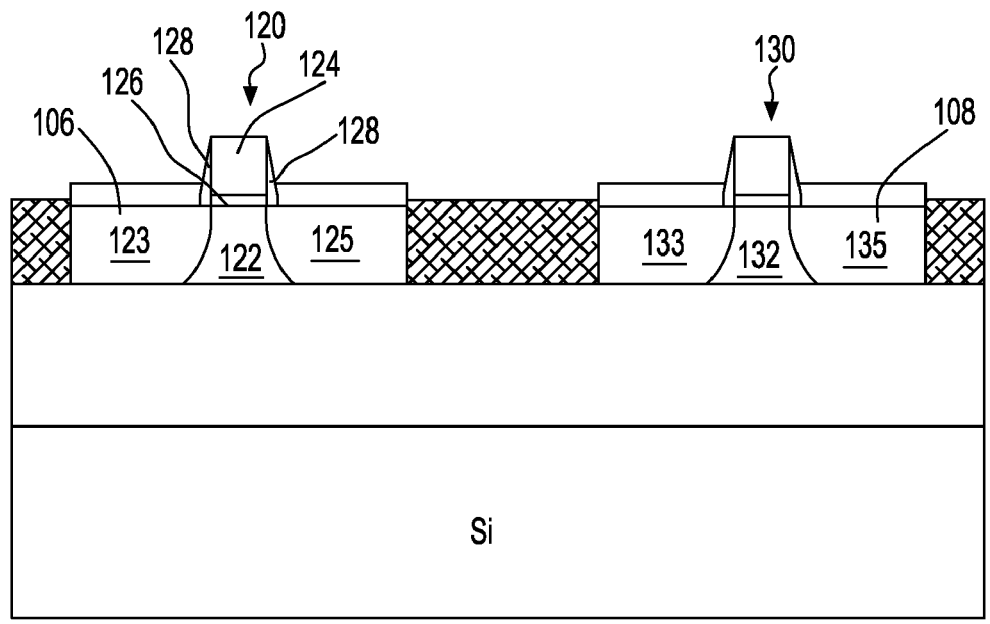
FIG.3  PFET   NFET
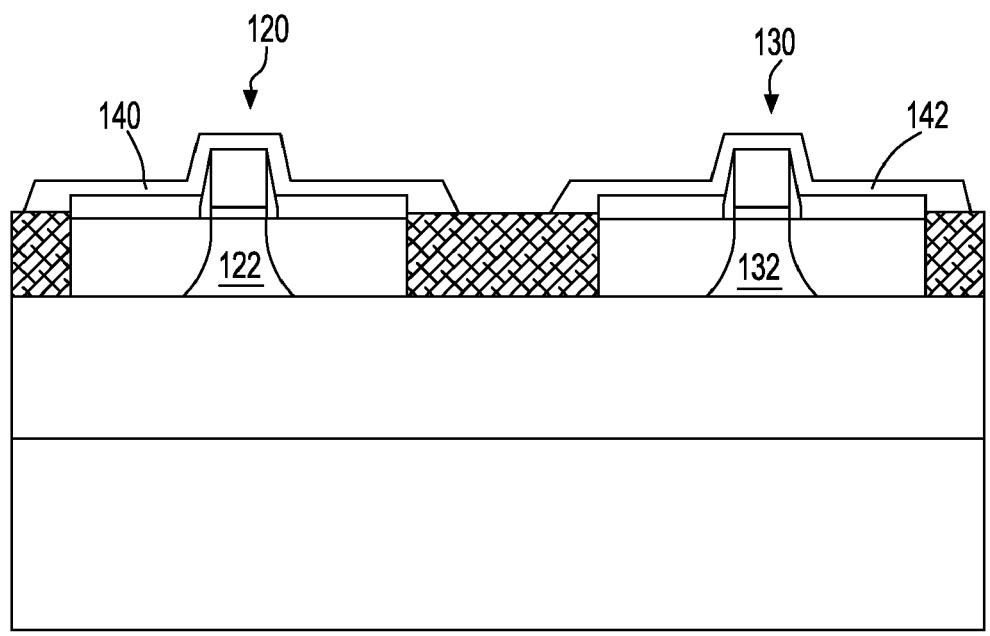
FIG. 4  PFET   NFET

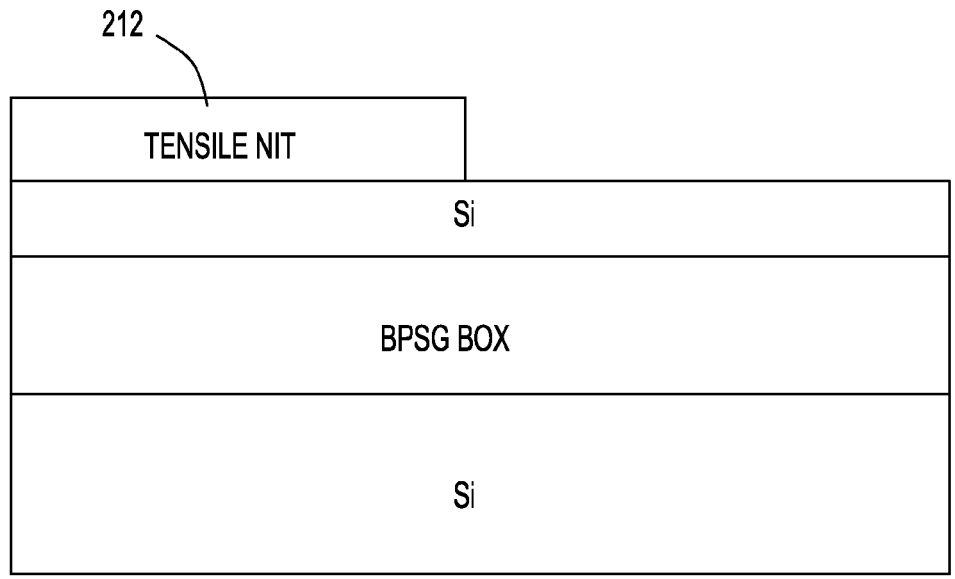
FIG. 7  PFET        NFET
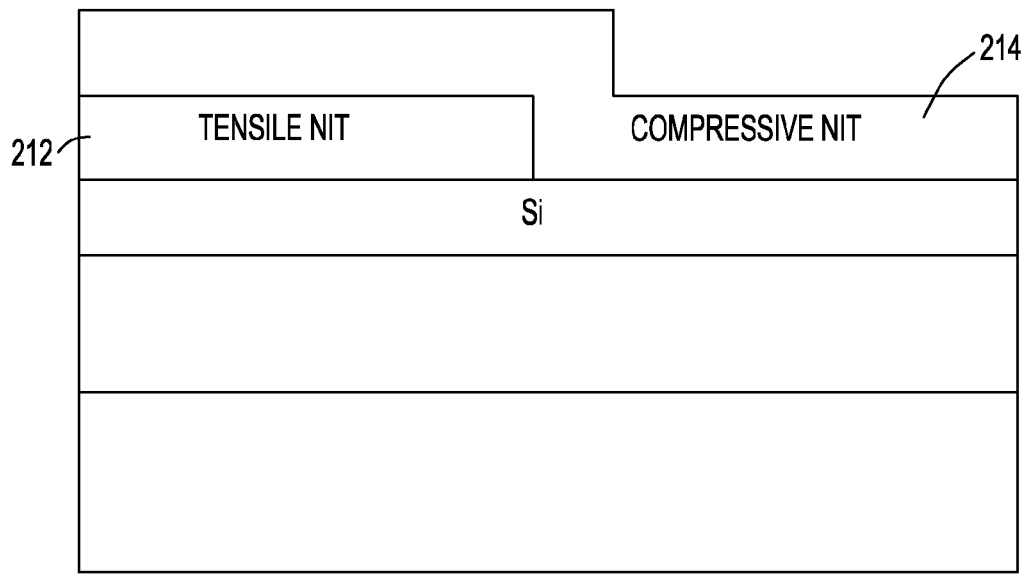
FIG. 8  PFET        NFET

US 7,888,197 B2

METHOD OF FORMING STRESSED SOI FET HAVING DOPED GLASS BOX LAYER USING SACRIFICIAL STRESSED LAYER

BACKGROUND OF THE INVENTION

The present invention relates to semiconductor devices and their fabrication. More particularly, the invention relates to preparation of a silicon-on-insulator ("SOI") substrate in which at least a portion of the SOI substrate is stressed.

Various methods exist for fabricating SOI substrates. In one particular example according to the prior art, illustrated in FIG. 1, an SOI substrate 10 is fabricated to contain a region of strained silicon 12 having tensile stress in which a transistor, for example, an n-type field effect transistor ("NFET") will be formed. The tensile stressed silicon region 12 overlies a region 14 containing silicon germanium (SiGe) having relaxed stress, and the SiGe region, in turn, overlies a bulk silicon region 18, as separated therefrom by a buried oxide ("BOX") layer 16 containing borophosphosilicate glass ("BPSG").

To fabricate the prior art SOI substrate 10, a starting SOI substrate is provided which includes a compressive top SiGe layer which overlies the bulk silicon layer 18, separated therefrom by a BOX layer including BPSG. Thereafter, a layer of silicon 12 is grown epitaxially from the surface of the SiGe layer. After patterning the silicon layer 12 and SiGe layer 14, e.g., by etching in accordance with a photolithographically defined mask layer (not shown), the temperature of the SOI substrate is elevated to a point at which the BPSG BOX layer 16 becomes flowable. This then causes the BOX layer 16 to soften and "flow". As a result, the stress in the SiGe layer 14 relaxes, and in consequence, a tensile stress develops in the silicon layer 12 above the SiGe layer 14.

One of the drawbacks of the prior art SOI substrate 10 is that after the active silicon region 12 is defined, the SiGe stressor layer 14 continues to underlie the active silicon region 12 in which the transistor is to be formed. This fact hinders some of the flexibility of the design of the transistor to be formed thereon, as the underlying SiGe layer 14 can contribute to junction capacitance, reducing the performance benefit to be gained from the SOI structure. In addition, the permanent presence of the SiGe layer 14 can lead to undesirable diffusion of germanium and arsenic into portions of the transistor to be formed in the active silicon region 12. Another drawback is that threading defects can occur which can lead to shorts of the gate dielectric.

SUMMARY OF THE INVENTION

A method is provided for fabricating a semiconductor-on-insulator ("SOI") substrate. In such method an SOI substrate is formed to include (i) an SOI layer of monocrystalline silicon separated from (ii) a bulk semiconductor layer (iii) a buried oxide ("BOX") layer including a layer of doped silicate glass. A sacrificial stressed layer is deposited onto the SOI substrate to overlie the SOI layer, which, in particular embodiments can include silicon nitride or silicon germanium. Trenches are then etched through the sacrificial stressed layer and into the SOI layer. The SOI substrate is heated with the sacrificial stressed layer sufficiently to cause the glass layer to soften and the sacrificial stressed layer to relax, to thereby apply a stress to the SOI layer to form a stressed SOI layer. The trenches in the stressed SOI layer are then filled with a dielectric material to form trench isolation regions contacting peripheral edges of the stressed SOI layer, the trench isolation regions extending downwardly from a major surface of the stressed SOI layer towards the BOX layer. The sacrificial stressed layer is then removed to expose the stressed SOI layer. One or more transistors, e.g., field effect transistors can then be formed in the stressed SOI layer. For example, the stressed SOI layer can have a compressive stress and the transistor can be formed which has an active semiconductor region disposed in the stressed SOI layer. In particular examples, the stressed SOI layer has compressive stress and the FET is a PFET, the stressed SOI layer has tensile stress and the FET is an NFET.

In accordance with a particular aspect of the invention, the doped silicate glass layer includes borophosphosilicate glass and the step of heating the SOI substrate is performed at a temperature of about 600° C. In accordance with such aspect, the stress in the stressed SOI layer can remain essentially fixed despite subsequent thermal processing, e.g., processing used to form a transistor.

In accordance with a particular aspect of the invention, the sacrificial stressed layer includes a first sacrificial stressed layer having one of a tensile or a compressive stress and a second sacrificial stressed layer having another one of a tensile or a compressive stress other than that of the first sacrificial stressed layer. The stressed SOI layer will then be formed having a first portion having one of compressive or tensile stress and a second portion having another one of compressive or tensile stress other than that of the first portion and one of a PFET and an NFET is formed in the first portion and the other of a PFET and an NFET is formed in the second portion.

In accordance with another aspect of the invention, a field effect transistor ("FET") is provided which includes a channel region disposed in a stressed monocrystalline silicon-on-insulator ("SOI") layer of a semiconductor-on-insulator ("SOI") substrate. The channel region has a large stress near an exposed major surface of the SOI layer, wherein the large stress is oriented in directions parallel to the exposed major surface of the SOI layer.

BRIEF DESCRIPTION OF THE DRAWINGS

FIG. 3 is a sectional view illustrating field effect transistors ("FETs") provided in a stressed SOI substrate in accordance with an embodiment of the invention.

FIG. 4 is a sectional view illustrating a variation of the embodiment illustrated in FIG. 3 in which stressed dielectric liners are provided which overlie the FETs.

FIGS. 5-12 are sectional views illustrating stages in fabrication of a stressed SOI substrate in accordance with one embodiment of the invention.

DETAILED DESCRIPTION

Figure 1:
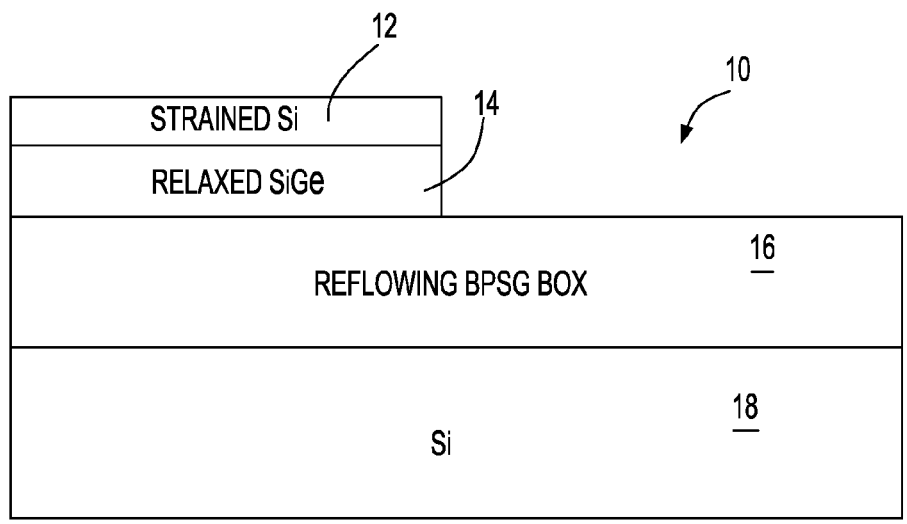
FIG. 1 is a sectional view illustrating a structure and method of fabricating a SOI substrate in accordance with the prior art.
Figure 2:
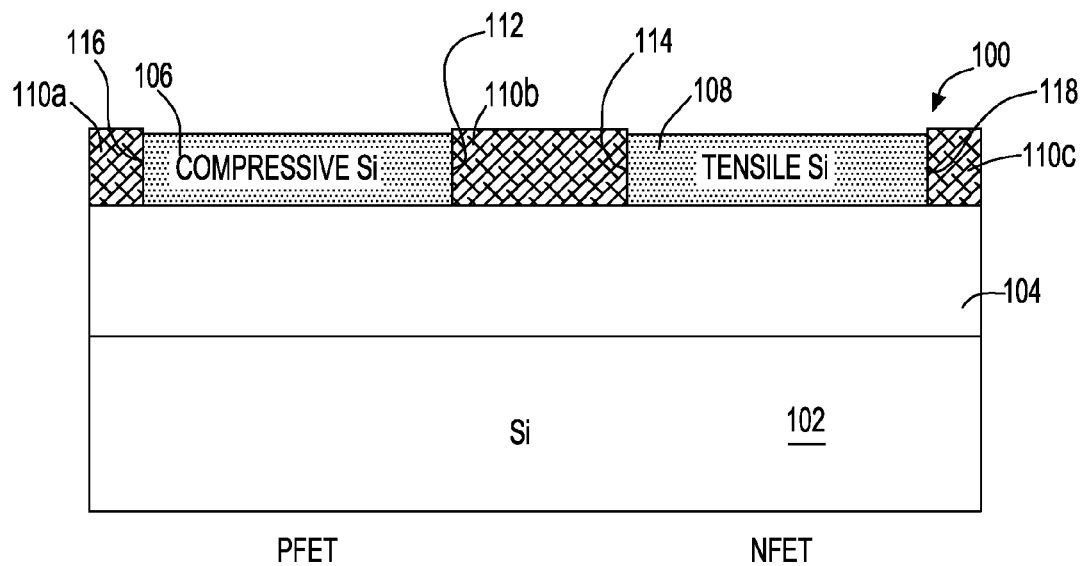
FIG. 2 is a sectional view illustrating a stressed SOI substrate in accordance with one embodiment of the invention.

An SOI substrate 100 according to a first embodiment of the invention is illustrated in FIG. 2. As illustrated therein, the SOI substrate includes a bulk semiconductor region 102, over which a buried oxide ("BOX") layer 104 is provided which includes doped silicate glass, for example borophosphosilicate glass ("BPSG"). The BOX layer consists essentially of doped silicate glass, and both boron and phosphorus dopants are dispersed typically throughout the layer, and typically evenly.

As further shown in FIG. 2, an SOI layer of the substrate includes a region 106 of compressive stressed monocrystalline silicon overlying the BOX layer 104. The SOI layer further includes a tensile stressed region 108 of monocrystalline silicon overlying the BOX layer 104. The BOX layer 104 separates the stressed silicon regions 106, 108 from the bulk semiconductor region 102. A trench isolation region 110b is disposed between peripheral edges 112, 114 of the two stressed silicon regions 106, 108, respectively. That trench isolation region 110b electrically isolates the stressed silicon regions 106, 108 from each other. Another trench isolation region 110a is disposed adjacent to a peripheral edge 116 of the compressive stressed silicon region which lies opposite edge 112. Another trench isolation region 110c is disposed adjacent to another peripheral edge 118 of the tensile stressed silicon region 108. The two trench isolation regions 110a, 110b disposed laterally adjacent to the compressive stressed silicon region 106 serve to hinder the stress from relaxing in the stressed silicon region 106, thereby maintaining the compressive stress therein. Similarly, the two trench isolation regions 110b, 110c disposed laterally adjacent to the tensile stressed silicon region 108 serve to hinder the stress from relaxing in the stressed silicon region 108, thereby maintaining the tensile stress therein.

A subsequent stage of fabrication is illustrated in FIG. 3, after further fabrication steps are performed to form a PFET 120 having a channel region 122, a source region 123 and a drain region 125 disposed within the compressive stressed silicon region 106. FIG. 2 further illustrates an NFET 130 having a channel region 132, a source region 133 and a drain region 135 disposed within the tensile stressed silicon region 108. A gate conductor stack of the PFET includes a gate 124 including semiconductive and/or conductive material, which is separated from the channel region 122 by a gate dielectric 126. A low-resistance layer including a metal and/or metal compound such as a conductive silicide contacts the source and drain regions 123, 125 for enhanced conductivity. Dielectric spacers 128 are typically provided on sidewalls of the gate 124, particularly when the low-resistance layer is provided. The NFET 130 has a similar gate conductor stack, as well as the low-resistance layer and dielectric spacers similar to that of the PFET.

The performance of a field effect transistor ("FET") benefits when a beneficial stress is applied to the active semiconductor region of the FET in the direction of the length of the FET's channel region. The performance of a p-type FET or "PFET" benefits the most when compressive stress is applied to the active semiconductor region. The performance of an n-type FET or "NFET" benefits the most when tensile stress is applied to the active semiconductor region in a direction of the length of the channel region.

Owing to the way in which the stressed active semiconductor regions in the SOI substrate are fabricated, the channel region of each FET desirably has a large stress near an exposed major surface (typically a top surface) of the SOI layer, i.e., the surface of the SOI layer which is contacted by the gate dielectric 126. The magnitude of the stress desirably peaks near that exposed major surface of the SOI layer. Moreover, the magnitude of the stress typically falls within the channel region in a direction (typically downwardly direction) from the major surface of the SOI layer towards a bottom surface of the SOI layer adjacent to the BOX layer. The stress magnitude may be much lower, for example: three to 300 times or more lower at the bottom surface of the SOI layer than at the major surface. The stress at the bottom surface may even be of the opposite polarity than the stress at the exposed major surface. For example, the stress may be compressive near the exposed major surface and tensile near the bottom surface, or the stress may be tensile near the exposed major surface and compressive near the bottom surface. In addition, the magnitude of the stress within the channel region desirably is uniform in a longitudinal direction of the FET, i.e., in a direction of current flow between the source region and the drain region across the channel region of the FET. Desirably, the magnitude of the stress is also mostly uniform in the transverse direction (direction of the width of the channel region), the stress magnitude typically falling at opposite transverse edges of the channel region.

In the foregoing example, an SOI substrate includes both compressive stressed and tensile stressed active semiconductor regions. PFETs are provided in the compressive stressed regions and NFETs are provided in the tensile stressed regions. However, in an alternative embodiment, both NFETs and PFETs need not be present on the same substrate. Some types of integrated circuits utilize NFETs or PFETs exclusively. For example, a dynamic random access memory ("DRAM") typically utilizes NFETs exclusively as array transistors.

In addition, both types of transistors need not be provided in the corresponding most beneficial type of stressed semiconductor regions. Thus, a substrate can be fabricated to contain active semiconductor regions which have compressive stress but without active semiconductor regions that have tensile stress. In such case, PFETs are ordinarily formed in the compressive stressed regions. Some NFETs may also be formed in compressive stressed regions of the substrate. However, it is recognized that NFETs fabricated in this way may incur a degradation of performance. Such substrate may also include active semiconductor regions which have neutral stress, in which case, NFETs may be provided in neutral stress regions without incurring performance degradation to the same degree.

Alternatively, a substrate can be fabricated to contain active semiconductor regions which have tensile stress but without active semiconductor regions that have compressive stress. In such case, desirably NFETs are formed in the tensile stress regions. Neutral stress regions may be provided also in such substrate, and PFETs be provided therein. Alternatively, only tensile stressed regions can be provided, and a design trade-off be made to provide the PFETs in tensile stressed regions, as well as the NFETs.

There are many ways to impart additional stress to the channel region of the FET. Among these ways are embedding a semiconductor alloy in regions of the transistor adjacent to the channel region. For example, embedded regions of silicon germanium can be provided in the source and drain regions adjacent to the channel region to impart a compressive stress to the channel region. Alternatively, embedded regions of silicon carbon can be provided in the source and drain regions adjacent to the channel region to impart a tensile stress to the channel region.

FIG. 4 illustrates another way in which additional stress can be imparted to the channel regions of FETs. Specifically, FIG. 4 illustrates a variation of the embodiment described above with reference to FIG. 3, wherein stressed dielectric liners 140 and 142 are provided overlying the source and drain regions of the PFET 120 and the NFET 130. Preferably, a compressive stressed dielectric liner 140 overlies the PFET 120, such liner serving to enhance the compressive stress applied to the channel region 122 of the PFET. Similarly, a tensile stressed dielectric liner 142 preferably overlies the NFET 130, such liner serving to enhance the tensile stress applied to the channel region 132 of the NFET. Generally, the stressed dielectric liners are provided such that one of the stressed dielectric liners overlaps the other. In the particular embodiment illustrated in FIG. 4, the edges of the stressed dielectric liners 140, 142 are spaced apart such that neither one of the stressed dielectric liners overlaps the other.

Figure 5:
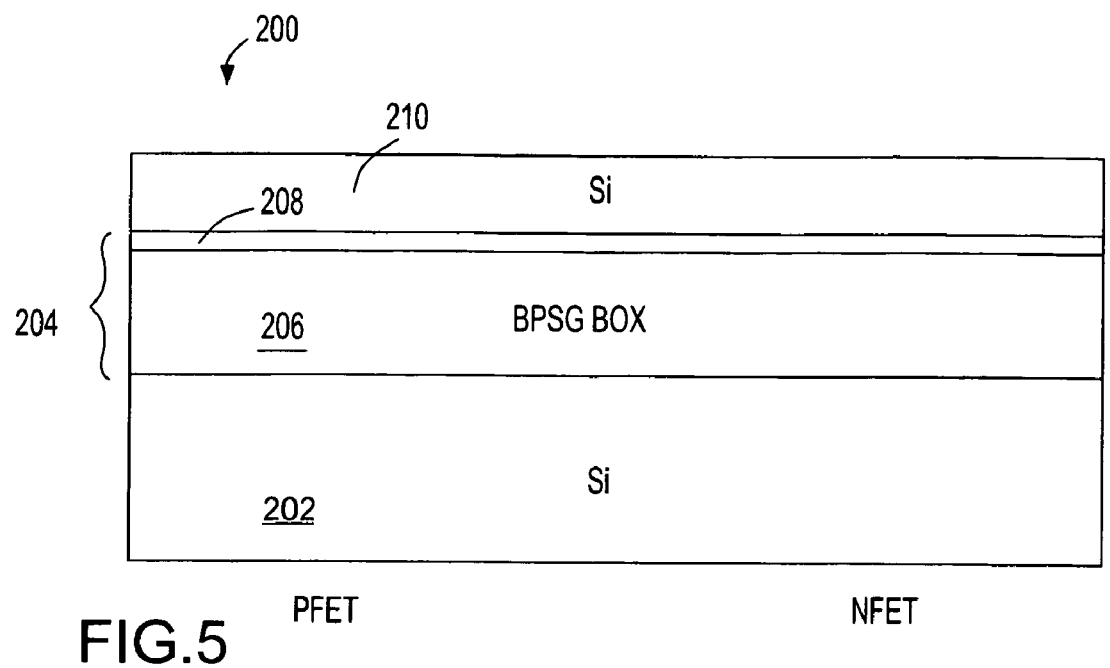

Referring to FIG. 5, a method will now be described for fabricating the SOI substrate illustrated in FIG. 2. FIG. 4 illustrates a preliminary stage of fabrication in which an SOI substrate 200 is provided which has a buried oxide ("BOX") layer 204 including a layer 206 consisting essentially of doped silicate glass. Preferably, layer 206 is doped with boron and phosphorus, such that it consists essentially of borophosphosilicate glass ("BPSG"). The BOX layer 204 overlies a bulk semiconductor region 202 of the substrate, and a silicon-on-insulator ("SOI") layer of monocrystalline silicon 210 overlies the BOX layer 204. Preferably, the dopant concentrations of boron and phosphorus are sufficiently high to give the BPSG layer a relatively low melting temperature. However, the dopant concentrations are not so high that the BPSG layer would begin to flow at temperatures of about 400 degrees C. at which subsequently deposited silicon nitride films 212, 214 (FIGS. 6-8) are deposited.

As illustrated in FIG. 5, preferably, a layer 208 of undoped silicon oxide is disposed between the BPSG layer 206 and the SOI layer 210. Such layer 208 acts to diminish the concentrations of boron and phosphorus that might result from diffusion from the BPSG layer 206 into the monocrystalline silicon layer 210 during later stages of fabrication. Hereinafter, references to BOX layer 204 should be understood as referring to both BPSG layer 206 and the optional undoped oxide layer 208 when provided in the substrate.

Typically, the SOI substrate 200 is provided by depositing a layer of BPSG to overlie a bulk silicon region of a first wafer, usually referred to as a "handle wafer", and thereafter depositing the optional undoped oxide layer to overlie the BPSG layer. The handle wafer is then bonded with the undoped oxide layer facing a monocrystalline semiconductor region of a second wafer which is referred to as a "bond wafer." After bonding, a relatively thin (e.g., 50 nm to 200 nm thick) monocrystalline SOI layer of the bond wafer is separated from the rest of the bond wafer in a process which can include one or more known techniques such as the known "smart cut" technique, resulting in the wafer structure as shown in FIG. 5. Alternatively, the bond wafer can be ground and polished from the back side such that only the thin SOI layer remains.

Figure 6:
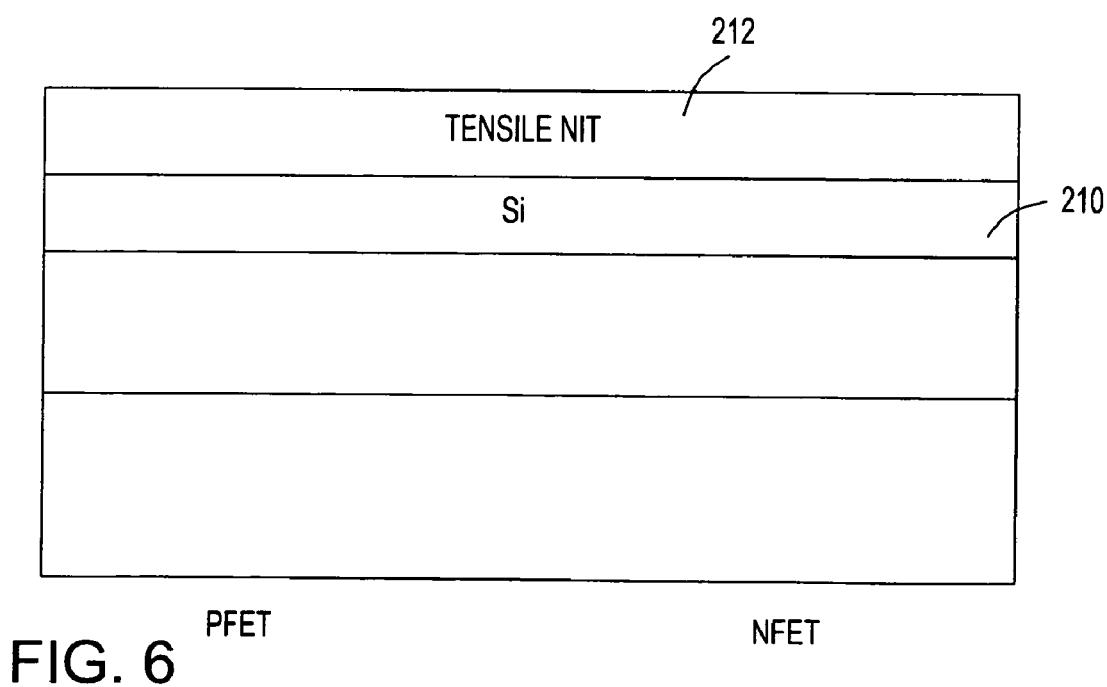

Thereafter, in the stage of fabrication illustrated in FIG. 6, a layer 212 including an internally stressed material is deposited to overlie the SOI layer 210. The layer can include, for example, a layer of silicon nitride, which when deposited under appropriate conditions, retains an internal stress after deposition. In the example illustrated in FIG. 6, a layer 212 of tensile stressed silicon nitride is formed to overlie the SOI layer 210. As deposited, the tensile stressed silicon nitride preferably has a stress of about 1.6 GPa or greater.

Thereafter, in the stage of fabrication illustrated in FIG. 7, the layer 212 of tensile nitride is patterned, e.g., by photolithographically patterning a photo-imageable mask layer such as photoresist and removing a portion of the layer 212 which is exposed after patterning the mask layer, such as by selective etching. Then, the photoimageable mask layer is removed, leaving the structure substantially as illustrated in FIG. 7.

Subsequently, as illustrated in FIG. 8, a layer 214 including a compressive stressed material is deposited to overlie the tensile stressed layer 212. Again, a variety of materials and methods can be used to form the compressive stressed layer 214. In the particular example illustrated in FIG. 8, the compressive stressed layer 214 consists essentially of silicon nitride, the layer being deposited under conditions amenable to providing an internal compressive stress.

Figure 9:
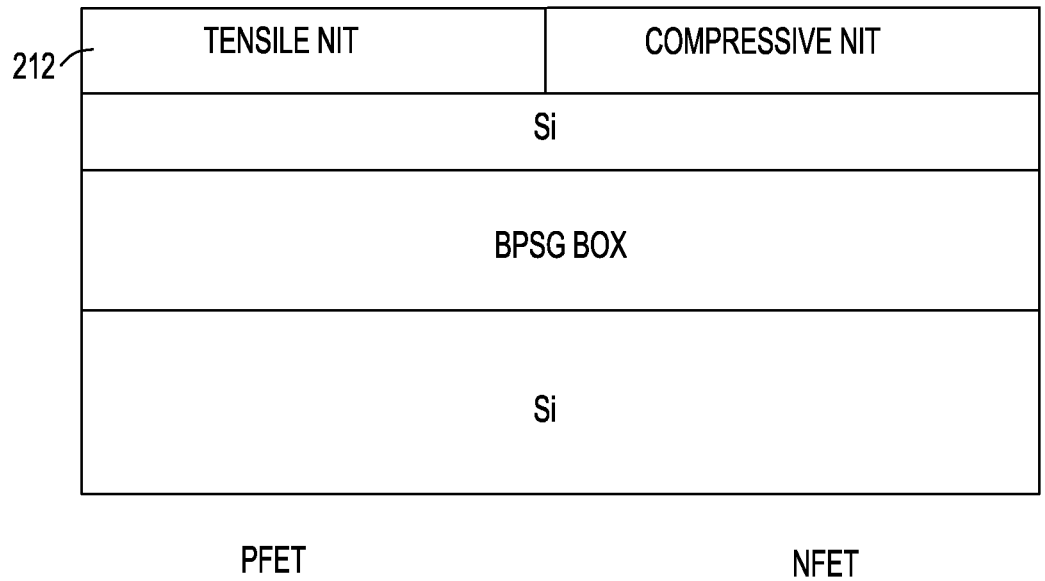

Thereafter, as illustrated in FIG. 9, a portion of the compressive stressed layer overlying the tensile stressed nitride layer 212 preferably is removed while preserving the portion of the compressive stressed layer 214 which is laterally adjacent to the tensile stressed layer 212. Such can be accomplished through use of one or more planarization techniques, e.g., a chemical mechanical polishing ("CMP") process, which are suitable for reducing surface topography. Another way to remove the compressive stressed material overlying the tensile stressed layer 212 is to perform a masked etch process through photolithographically defined openings in a photoimageable, e.g., photoresist layer, the openings being registered with the tensile nitride layer 212. Removal of the compressive nitride overlying the tensile nitride assists in providing a desirably high magnitude stress in the resulting compressive stressed active semiconductor region 106 (FIG. 2).

Figure 10:
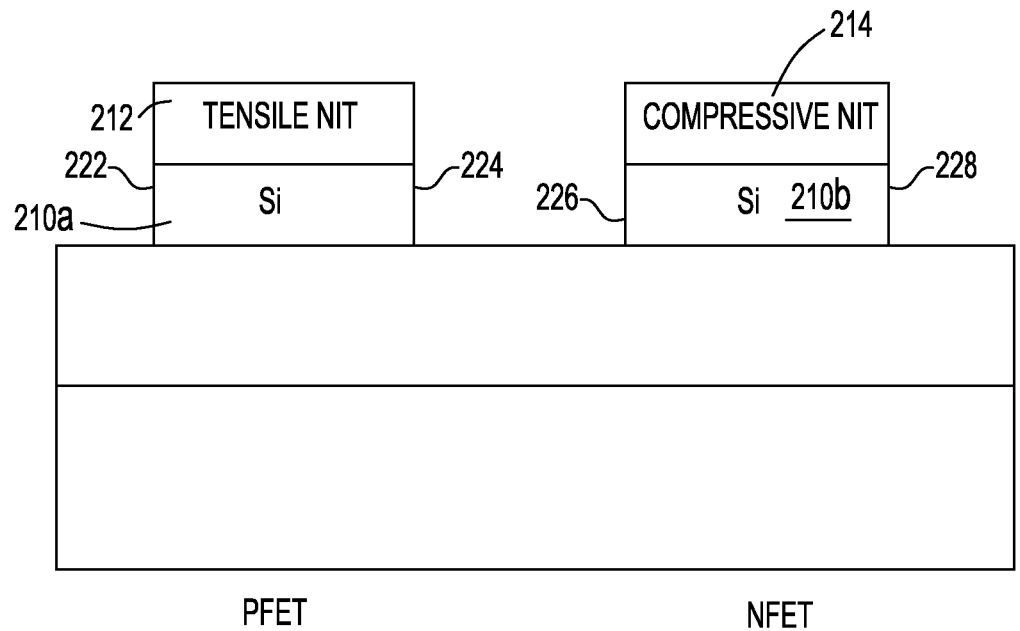

Thereafter, in a subsequent stage of fabrication illustrated in FIG. 10, photolithography is used to pattern openings in a photoimageable mask layer (not shown) overlying the tensile and compressive stressed layers 212, 214. Thereafter, these layers 212, 214 are patterned with the SOI layer in accordance with the openings in the mask layer, to define separate active semiconductor regions 210a and 210b having peripheral edges 222, 224, 226 and 228, with openings 220 (FIG. 11) adjacent to the peripheral edges.

Next, the substrate including the stressed layers 212, 214 thereon is elevated to a temperature at which the BPSG material within the BOX layer 204 softens. Such temperature, typically at around 600 degrees C., is below a temperature which would directly cause the material properties of the stressed layers 212, 214 to change.

As the BPSG material softens, it becomes pliable. The pliability of the BPSG material permits the stresses in the overlying stressed layers 212, 214 and active semiconductor regions 210a, 210b to move closer to equilibrium. As a result, the tensile stress within the tensile layer 212 tends to relax, causing the underlying active semiconductor region 210a to become a compressive stressed silicon region. In addition, the compressive stress within the compressive layer 214 also tends to relax, causing the underlying active semiconductor region 210b to become a tensile stressed silicon region.

Figure 12:
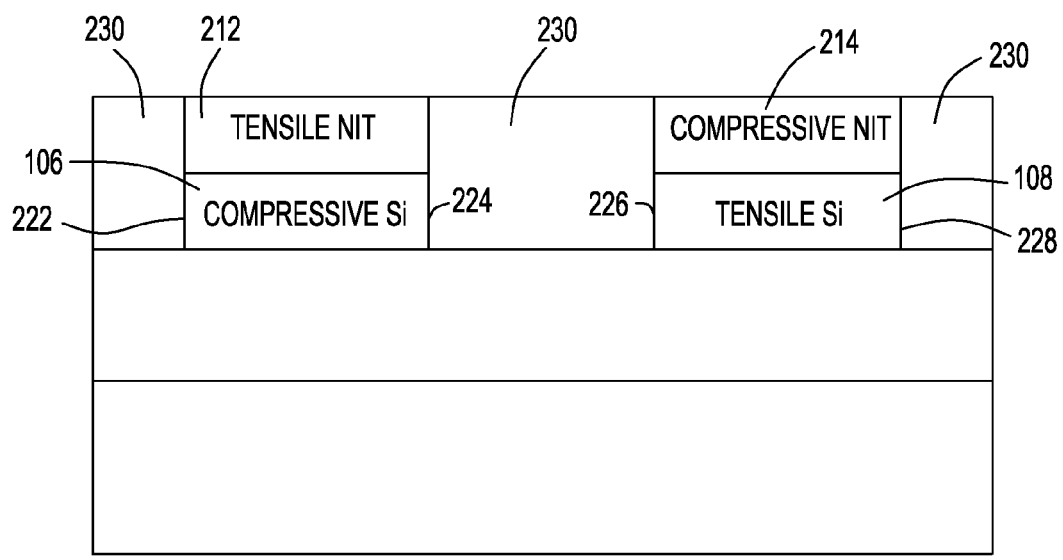

Thereafter, in a subsequent stage of fabrication illustrated in FIG. 12, trench isolation regions 230 are formed. Illustratively, the trench isolation regions are formed by depositing a layer of oxide, e.g., from a tetraethylorthosilicate ("TEOS") precursor, silane ($Si_4$), spin-on-glass, or other suitable method, and then removing excess oxide material which overlies the compressive layers 212, 214, such as by an etch-back process or CMP. The STI formation process does not relax the stress because the overlying stressed layers are still present.

As shown in FIG. 12, one trench isolation region 230 occupies an opening between an edge 224 of the tensile stressed active semiconductor region 106 and the adjacent edge 226 of the compressive stressed active semiconductor region 108. Additional trench isolation regions 230 are disposed at other peripheral edges 222 and 228 of the stressed semiconductor regions which are remote from those edges 224, 226, respectively. With these trench isolation regions now in place, the stresses within each of the active semiconductor regions 106, 108 are essentially "locked in"; i.e., essentially fixed. The thermal budget of subsequent processing will not be sufficient to change the state of the stress within each region 106, 108. The stress remains at or close to the level that exists just after completing this stage of fabrication.

Referring again to FIG. 2, thereafter, the compressive nitride layers are removed, such as by performing etching and cleaning processes selectively to the underlying silicon material in the stressed semiconductor regions 106, 108. Such etching and cleaning processes tend to reduce the height of the trench isolation regions 110a, 110b, 110c, such that the resulting structure appears as shown in FIG. 2.

Figure 11:
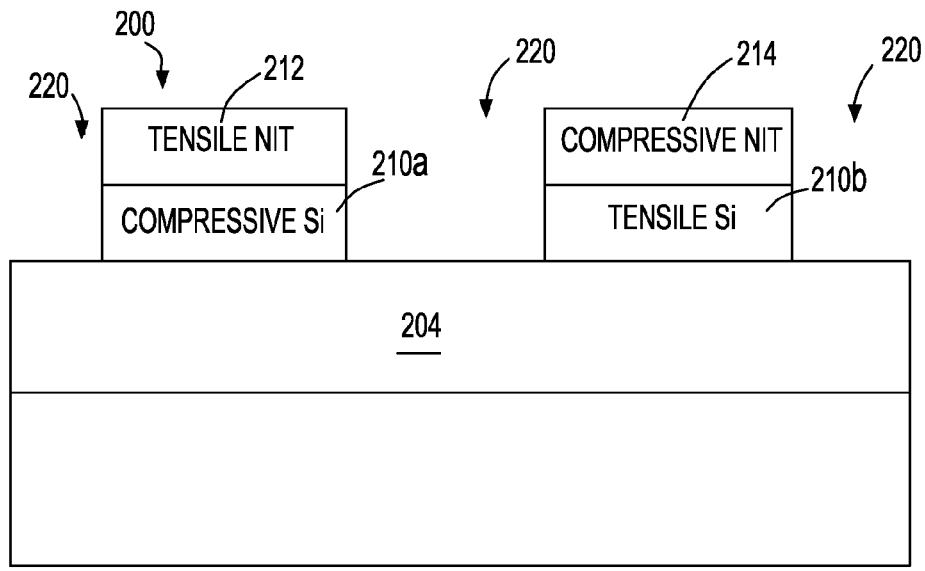

In a variation of the above embodiment, the portion of the compressive stressed layer 214 which overlies the tensile stressed layer 212 (FIG. 8) is not removed prior to the step of elevating the temperature of the substrate to impart the stresses in each of the active semiconductor regions 210a, 210b (FIG. 11). Due to the tensile nitride layer 212 being closer to the active semiconductor region 210a, it is still possible to achieve compressive stress in the active semiconductor region 210a, although it may be diminished somewhat in relation to the above-described process.

Figure 13:
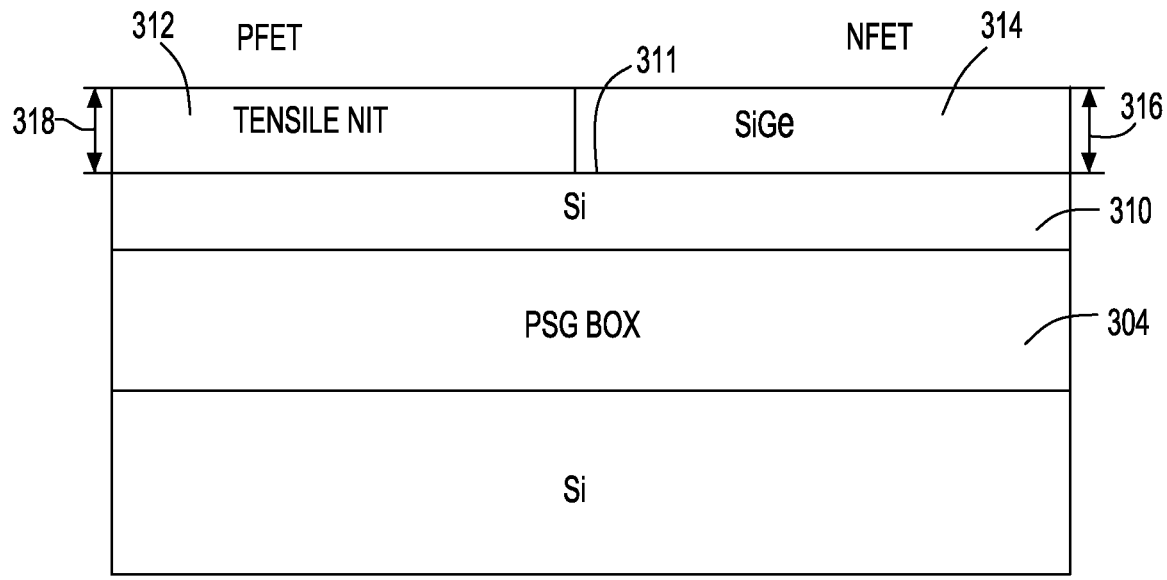
FIGS. 13-16 are sectional views illustrating stages in fabrication of a stressed SOI substrate in accordance with a variation of the embodiment of the invention illustrated in FIGS. 5-12.
Figure 14:
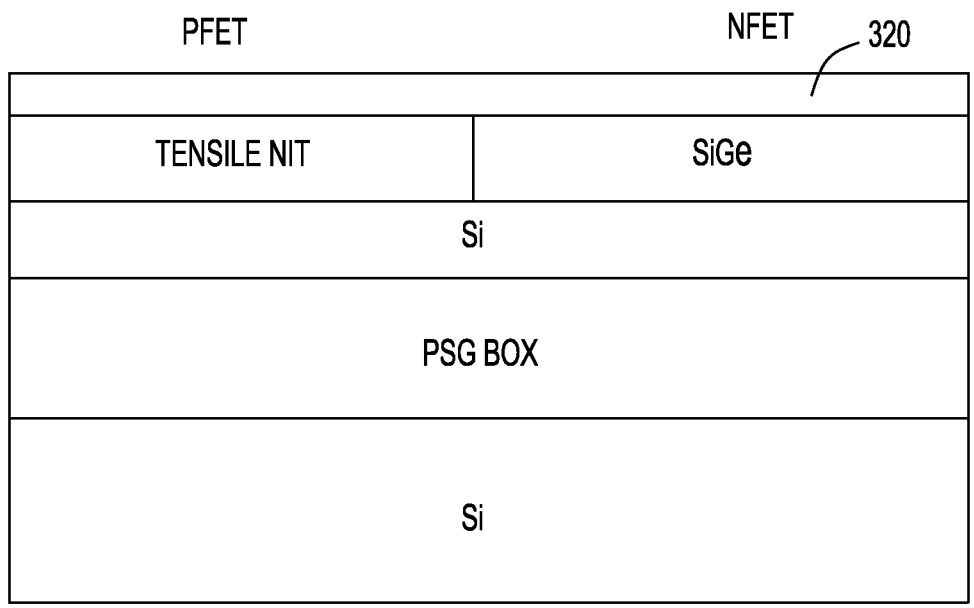

Another variation of the above-described embodiment will now be described with reference to FIGS. 13-16. Referring to FIG. 13, in the method of fabrication according to this embodiment, only one layer 312 of the stressed layers 312, 314 consists essentially of silicon nitride. The other stressed layer 314 is provided, for example, as a region consisting essentially of silicon germanium ("SiGe"), wherein a relative percentage weight of germanium is between about 1% and 99% of the total quantity of (silicon and germanium) semiconductor material therein. Using different stressed materials (silicon nitride and SiGe) for each of the stressed layers, it may be less problematic to achieve non-overlapping stressed layers 312, 314. As indicated above, providing non-overlapped stressed layers 312, 314 is helpful to avoid diminishing the magnitude of stress which results in the underlying active semiconductor regions.

To fabricate the structure illustrated in FIG. 13, the steps described above with respect to FIGS. 5 through 7 are followed, with the exception that the doped silicate glass layer is doped with phosphorus but does not contain a substantial concentration of boron. Desirably, the doped glass layer consists essentially of phosphosilicate glass ("PSG"). After the tensile stressed nitride layer 312 is formed and patterned, the stressed SiGe layer 314 is selectively epitaxially grown on the exposed major surface 311 of the underlying SOI layer 310. This process is preferably controlled so that the resulting SiGe layer has height 316 above the major surface 311 of the SOI layer which is about the same as the height 318 of the stressed nitride layer above the surface 311.

PSG is preferred as the doped glass layer of the BOX layer 304 instead of BPSG. The BOX layer is required to have a higher melting temperature material than that normally attainable by BPSG in order for the BOX layer to remain hard at a temperature (e.g., 600 to 700 degrees C.) at which the selective epitaxial growth of the SiGe layer is performed. The BOX layer must remain hard during growth of the SiGe layer in order to avoid premature transfer of the stresses to the underlying SOI layer 310. The material choice of the BOX layer allows for greater thermal budget in subsequent processing steps.

After growing the SiGe layer 314, a hard mask layer 320, preferably having neutral stress, is deposited to overlie the tensile stressed silicon nitride layer 312 and the compressive stressed SiGe layer 314. The hard mask layer preferably consists essentially of low stress or zero stress silicon nitride, for example.

Figure 15:
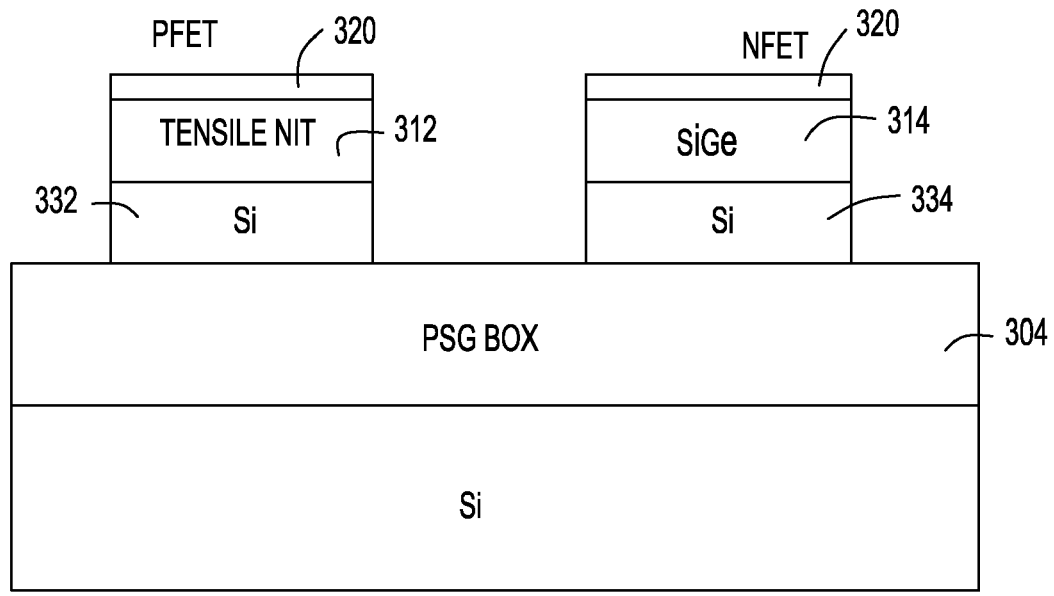

Thereafter with reference to FIG. 15, the SOI layer is patterned together with the overlying stressed layers 312, 314 and hard mask layer 320. This results in the structure as shown in FIG. 15 in which separate active semiconductor regions 332 and 334 overlie the BOX layer 304, one semiconductor region 332 having compressive stress and the other semiconductor region having tensile stress.

Figure 16:
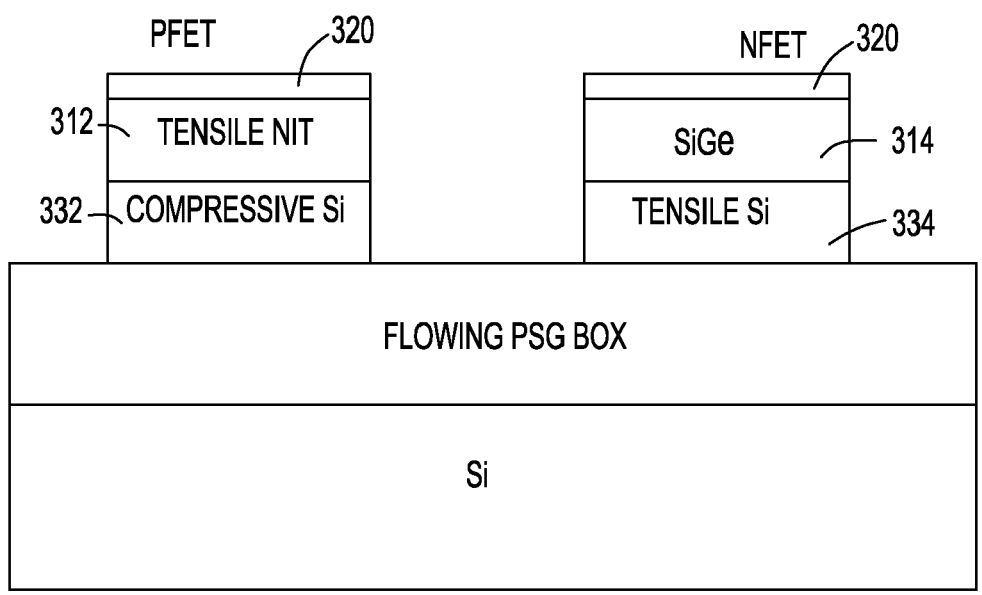

Then, referring to FIG. 16, the substrate is elevated to a temperature at which the PSG material of the BOX layer 304 softens sufficiently to transfer stress from the stressed layers 312, 314 to the active semiconductor regions 332, 334. To reach this condition, typically the PSG layer must be elevated to a temperature of about 900 degrees C.

Processing then resumes in a manner similar to that described above with reference to FIGS. 11, 12 and 2, to produce a stressed SOI substrate similar to that shown in FIG. 2. However, in this case, the hard mask layer 320 (FIG. 16) preferably remains in place during the formation of the trench isolation regions, the hard mask layer finally being removed when the stressed layers 312, 314 are removed to expose the stressed active semiconductor regions 106, 108 (FIG. 2). Thereafter, an NFET is formed in the tensile stressed silicon region 108 and a PFET is formed in the compressive stressed silicon region 106 in a manner as described above with reference to FIG. 3 or FIG. 4.

Figure 17:
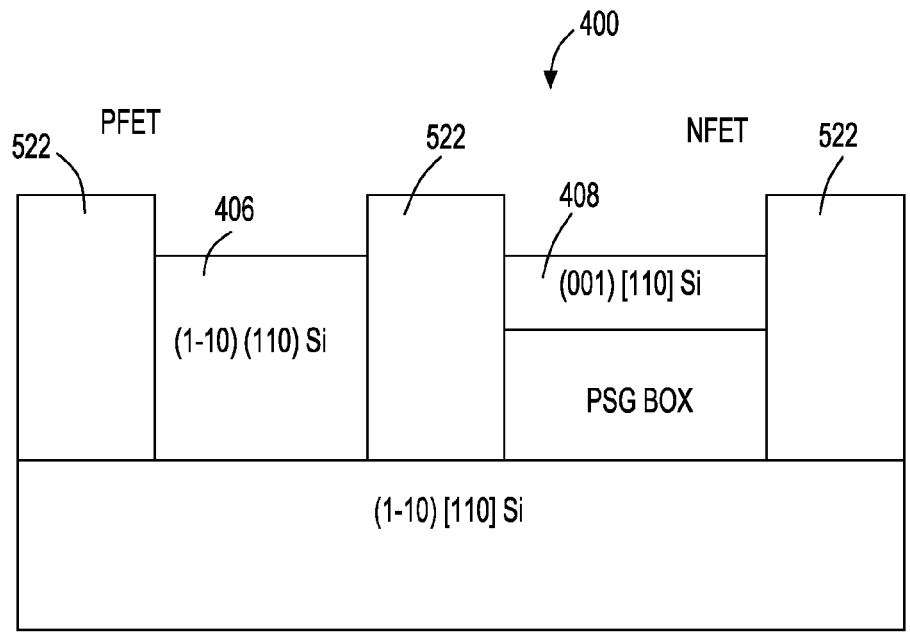
FIGS. 17-24 are sectional views illustrating stages in fabrication of a hybrid orientation technology ("HOT") stressed SOI substrate in accordance with one embodiment of the invention.

Turning now to FIG. 17, an SOI substrate 400 will now be described in which monocrystalline silicon regions 406, 408 having different crystal orientations are exposed at a major surface of the substrate 400. Such substrate is usually referred to as a "hybrid orientation technology" ("HOT") substrate, in that PFET and NFET transistors are fabricated in respective silicon regions having different crystal orientations. In the example illustrated in FIG. 17, semiconductive elements of a PFET will be formed in the silicon region 406 having a (1-10)[110] crystal orientation. Similarly, the semiconductive elements of an NFET will be formed in the silicon region 408 which has a (001)[110] crystal orientation. Alternatively, to further enhance performance, the silicon region 408 can be formed to have (001)[100] crystal orientation, and the semiconductive elements of the NFET be formed in such region. Trench isolation regions 522 are disposed between the active semiconductor regions 406, 408 for providing electrical isolation.

The transistors to be formed in the substrate are similar to the PFET 120 and NFET 130 shown and described above with reference to FIGS. 3 and 11. Therefore, their description need not be repeated again here.

In addition to the different crystal orientations provided in the substrate, the silicon region 408 is stressed in a way that is beneficial to the performance of the NFET which will be formed subsequently therein. Preferably, the silicon region 408 is formed to have an internal tensile stress so as to enhance the performance of an NFET to be formed therein. The trench isolation regions 522 further serve to maintain the stress within the tensile stressed region 408.

Figure 18:
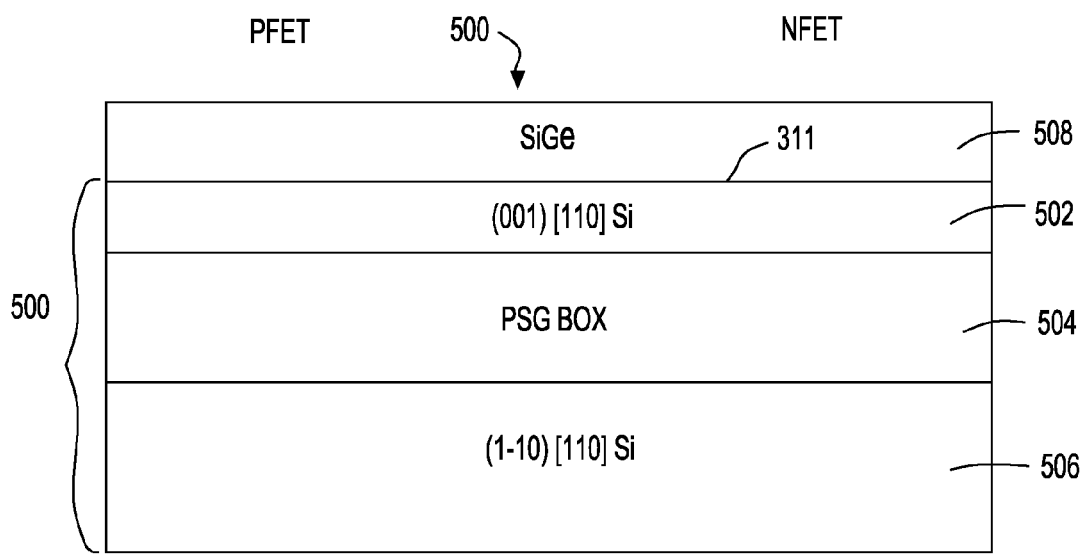

Referring now to FIG. 18, a method will now be described for fabricating the HOT substrate 400 illustrated in FIG. 17. At a preliminary stage of fabrication, an SOI substrate 500 is provided which includes a layer 502 of monocrystalline silicon having the (001)[110] crystal orientation overlying a BOX layer 504, the BOX layer 504 in turn, overlying a bulk monocrystalline silicon region 506 having the (1-10)[110] crystal orientation. The BOX layer 504 preferably includes a doped silicate glass layer having a moderately high melting temperature, such doped glass layer preferably consisting essentially of phosphosilicate glass ("PSG").

The SOI substrate 500 preferably is fabricated by a process similar to that described above with reference to FIG. 5. However, in this case, the bulk silicon region of the handle wafer has a particular crystal orientation (1-10)[110] and that handle wafer is bonded to a bond wafer which has an exposed monocrystalline silicon region having a different crystal orientation, i.e., the (001)[110] crystal orientation. After forming the SOI substrate, a layer 508 consisting essentially of monocrystalline silicon germanium (SiGe) is epitaxially grown from the major surface 311 of the SOI layer 502, such layer having a compressive internal stress. Typically, the SiGe layer is grown at a temperature between about 600 and 700 degrees C.

Figure 19:
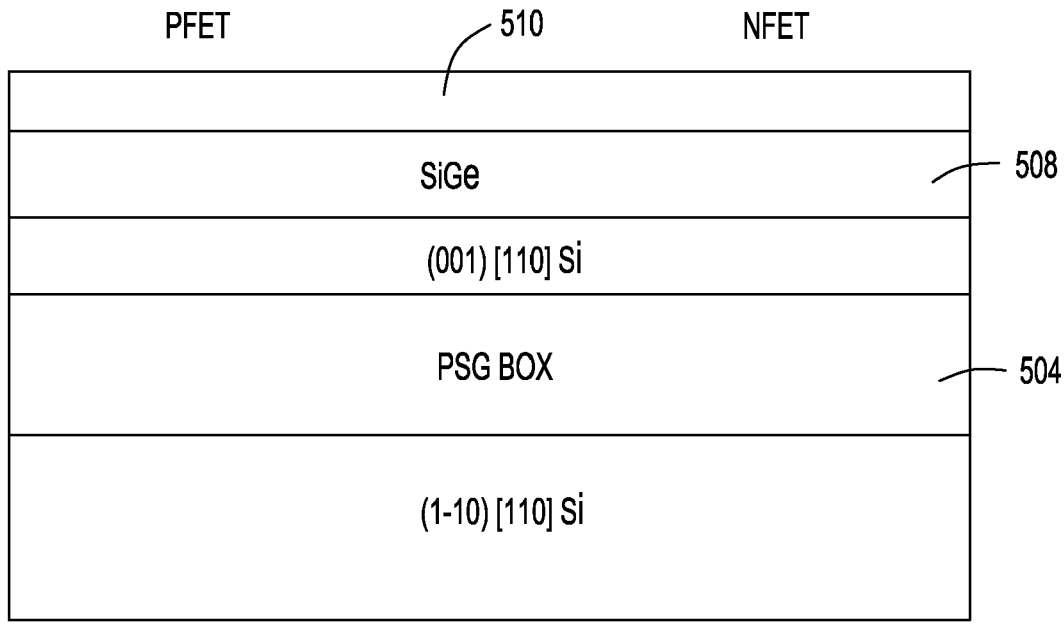

Thereafter, in the stage of fabrication illustrated in FIG. 19, a hard mask layer 510, such as a layer consisting essentially of zero stress or low stress silicon nitride, for example, is deposited to overlie the SiGe layer 508. Preferably, this layer 510 is deposited at a relatively low substrate temperature so as not to cause the PSG portion of the BOX layer 504 to soften and become flowable. For example, the hard mask layer 510 is deposited at a substrate temperature of between about 400 and 700 degrees C.

Figure 20:
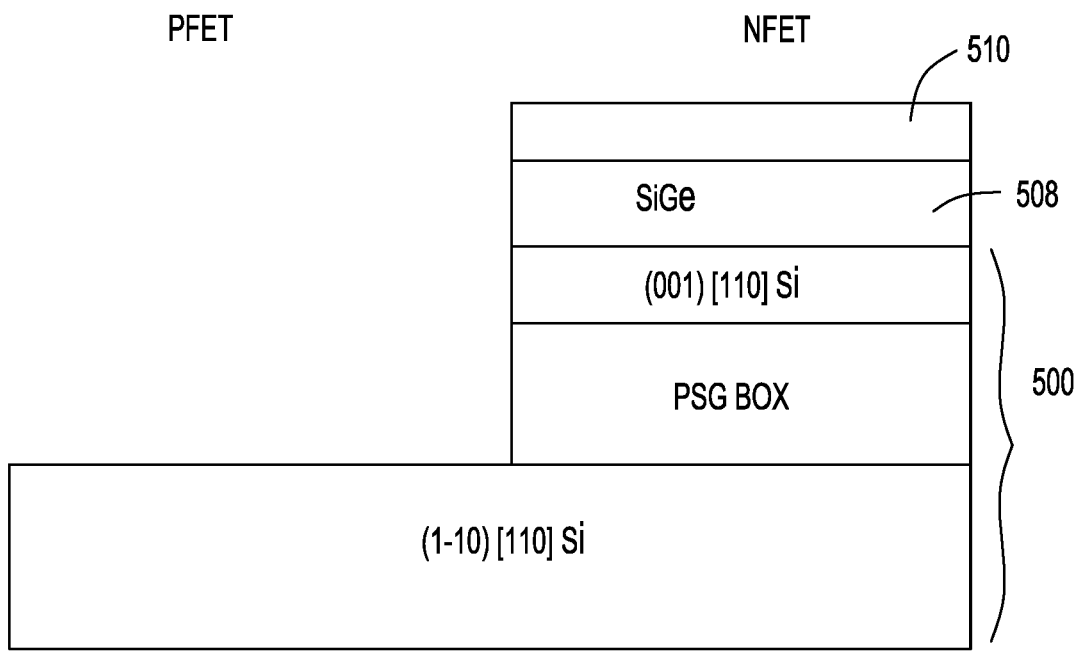

Subsequently, the SOI substrate 500, together with the overlying SiGe layer 508 and hard mask layer 510 are patterned in accordance with a photolithographically patterned photoresist layer (not shown) until the (1-10)[110] orientation bulk silicon layer is exposed, resulting in the structure as illustrated in FIG. 20.

Figure 21:
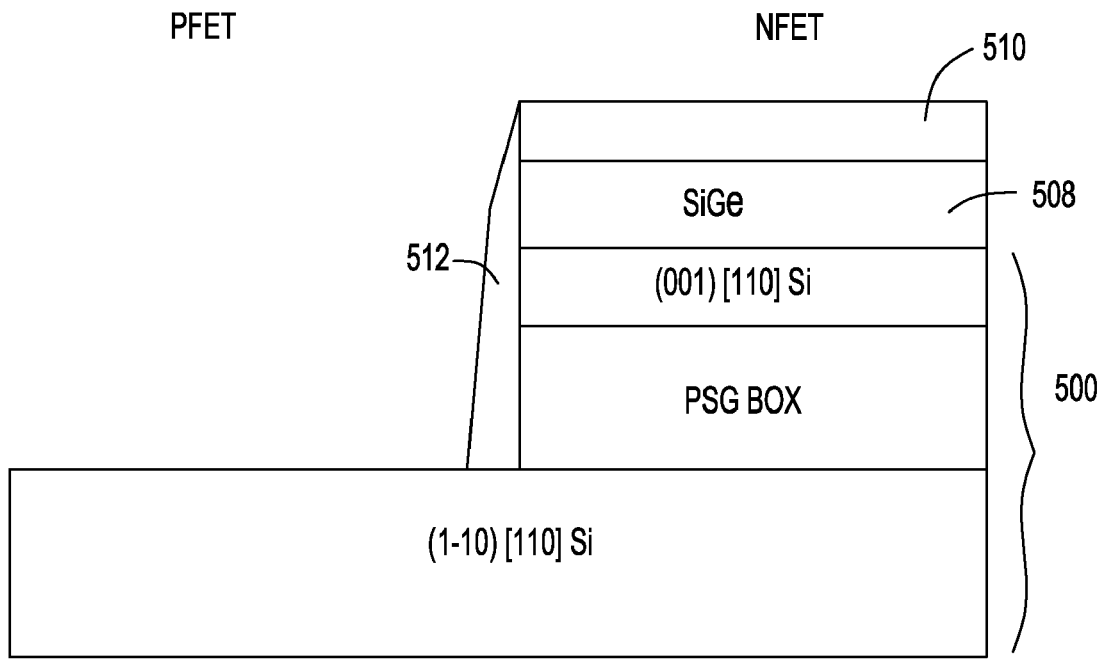

Thereafter as illustrated in FIG. 21, a dielectric spacer 512 is formed along the resulting sidewall of the substrate 500 and layers 508 and 510. Preferably, the dielectric spacer is formed in a manner similar to that shown and described in U.S. patent application Ser. No. 11/548,428 of Yun-Yu Wang et al., filed Oct. 11, 2006 the disclosure of which is hereby incorporated by reference herein. In a particular embodiment, the dielectric spacer is formed as a combination of a silicon nitride spacer, over which a somewhat relatively thinner silicon oxide spacer is formed.

Figure 22:
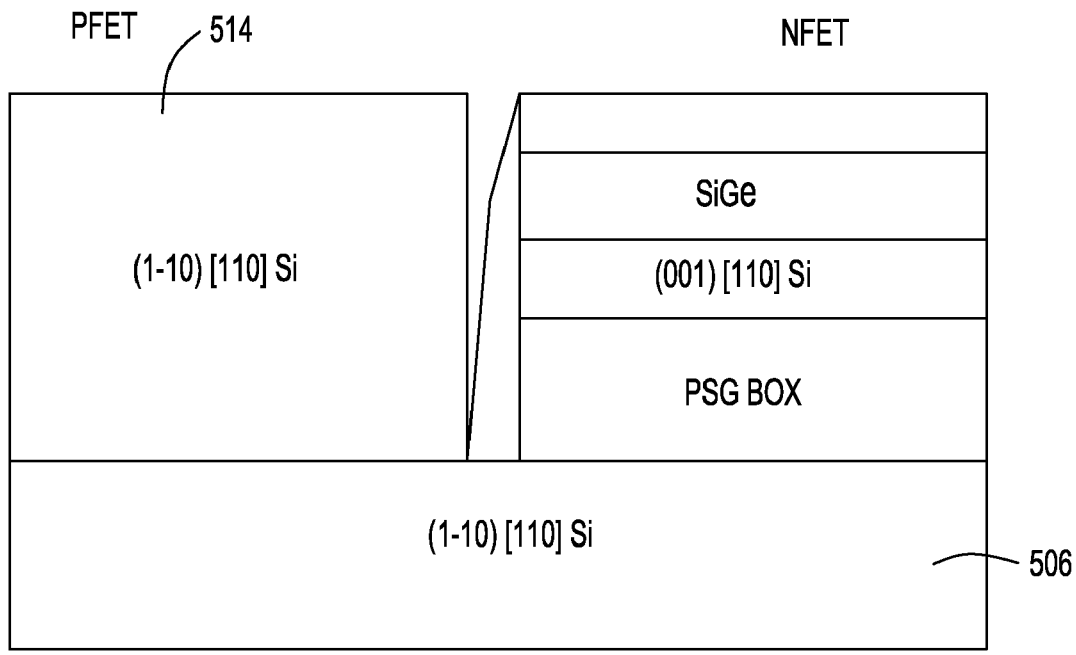

Thereafter, as illustrated in FIG. 22, an epitaxial layer 514 of silicon is grown from the exposed major surface of the bulk silicon layer 506. Such layer 514 has the same (1-10)[110] crystal orientation as that of the bulk silicon region 506 as a result of being grown from the bulk region.

Figure 23:
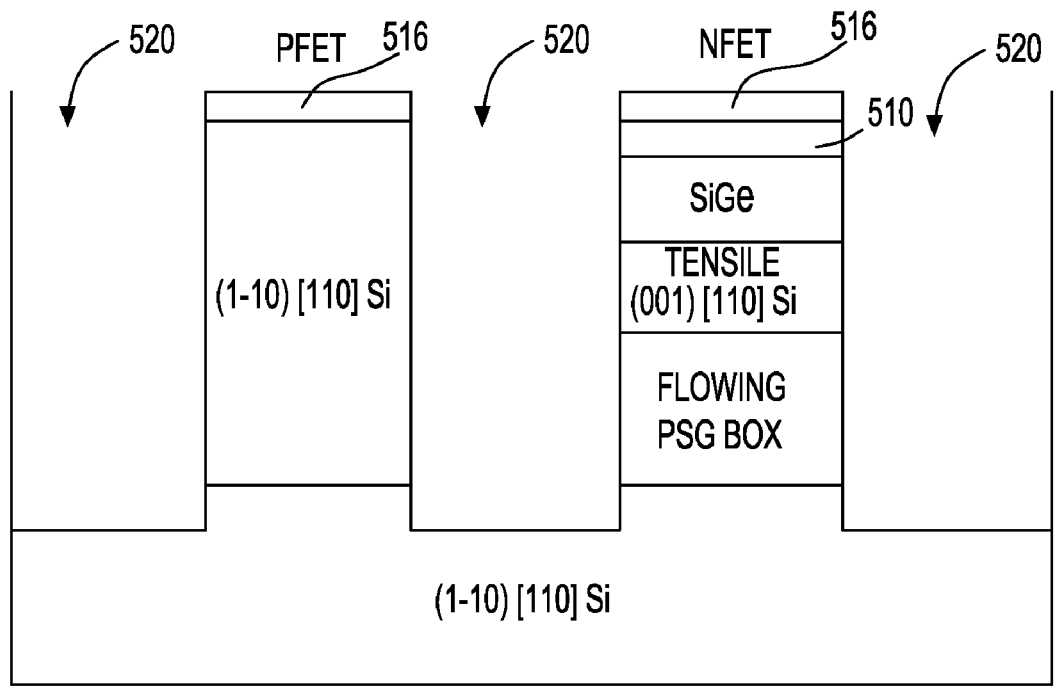

Referring to FIG. 23, processing is now conducted to form a trench 520 between the (1-10)[110] orientation epitaxial layer and the tensile (001)[110] orientation semiconductor layer. Trenches 520 are also formed at remote edges of these semiconductor layers. In an exemplary process, the trenches are formed by depositing a hard mask layer 516, such as a layer consisting essentially of silicon nitride, to overlie the epitaxial layer 514 as well as the pre-existing hard mask layer 510. The hard mask is then patterned in accordance with a corresponding pattern in a photoimageable layer (not shown), e.g., photoresist layer, disposed above such hard mask layer. Using the patterned hard mask, portions of the structure including epitaxial layer 514 which are exposed through an opening in the hard mask are then etched to form the trenches 520.

Figure 24:
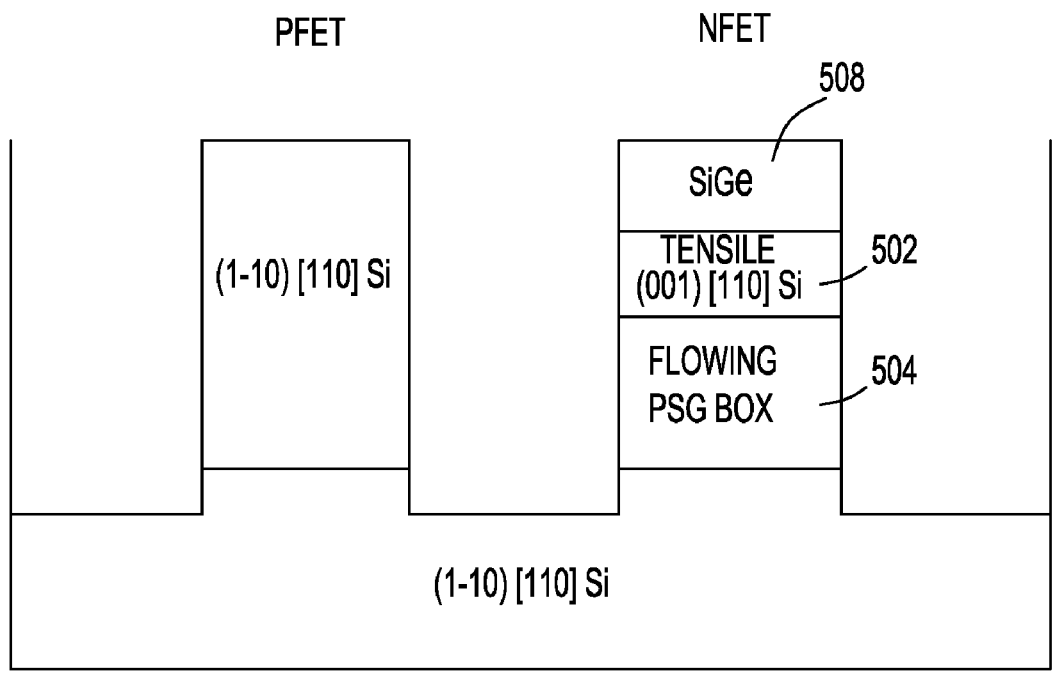

Thereafter, any portion of the hard mask layer that remains is now removed by etching, cleaning, stripping, etc., to produce the structure illustrated in FIG. 24. As further illustrated in FIG. 24, the substrate is also then heated to a temperature sufficient to cause at least the PSG portion of the BOX layer 504 to soften and become flowable. As in the above-described embodiments, some of the compressive stress present in the SiGe layer 508 is now transferred to the monocrystalline silicon layer 502, causing the silicon layer 502 to have an internal tensile stress.

Thereafter, referring again to FIG. 17, an oxide is deposited to fill the trenches, which is preferably followed by a planarization process, e.g., CMP, to form the trench isolation regions 522. Thereafter, the SiGe layer overlying the tensile stressed active silicon region 408 is removed by a selective etch process, such that both of the active silicon regions 406, 408 are exposed following its removal.

Figure 25:
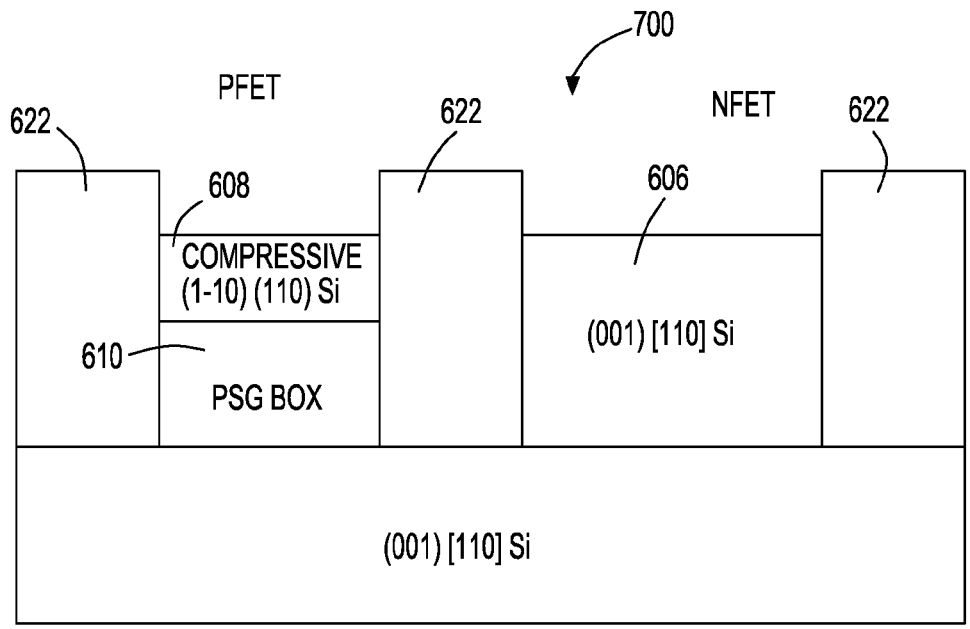
FIGS. 25-29 are sectional views illustrating stages in fabrication of a hybrid orientation technology ("HOT") stressed SOI substrate in accordance with a variation of the embodiment of the invention illustrated in FIGS. 17-24.

FIG. 25 illustrates a variation of the HOT embodiment described above with respect to FIG. 17. This example is similar to that shown and described above with reference to FIG. 17 in that the active semiconductor region 608 in which the PFET will be formed has a crystal orientation of (1-10)[110]. However, in this case, the PFET is provided in a compressive stressed active silicon region 608 overlying the BOX layer, while the NFET is provided in an epitaxial active silicon region 606 having the (001)[110] crystal orientation. Trench isolation regions 622 electrically isolate the active silicon regions 606, 608 from each other, as well as serving to maintain the stress within the compressive silicon region 608.

Figure 26:
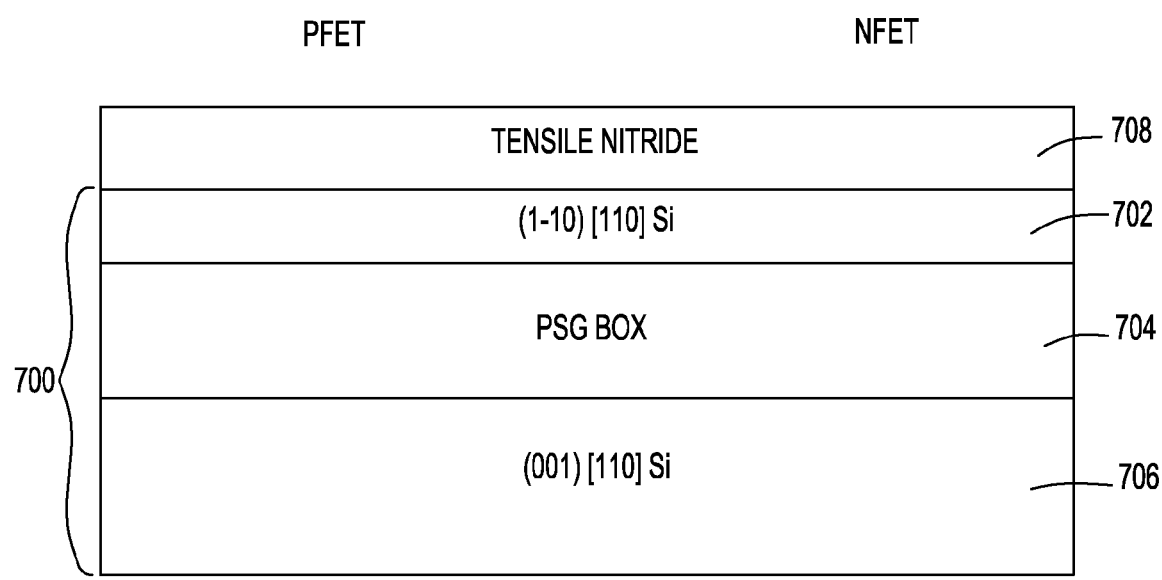

Turning now to FIG. 26, an exemplary method will now be described for preparing the SOI substrate illustrated in FIG. 25. Shown in a preliminary stage of fabrication, an SOI substrate 700 includes a bulk silicon substrate region 706 having the (001)[110] crystal orientation, an SOI layer 702 having a (1-10)[110] crystal orientation, and a BOX layer 704 disposed between the SOI layer 702 and bulk silicon region 706. A stressor layer 708 having an internal tensile stress overlies the SOI layer 702, the stressor layer consisting essentially of silicon nitride, for example.

Figure 27:
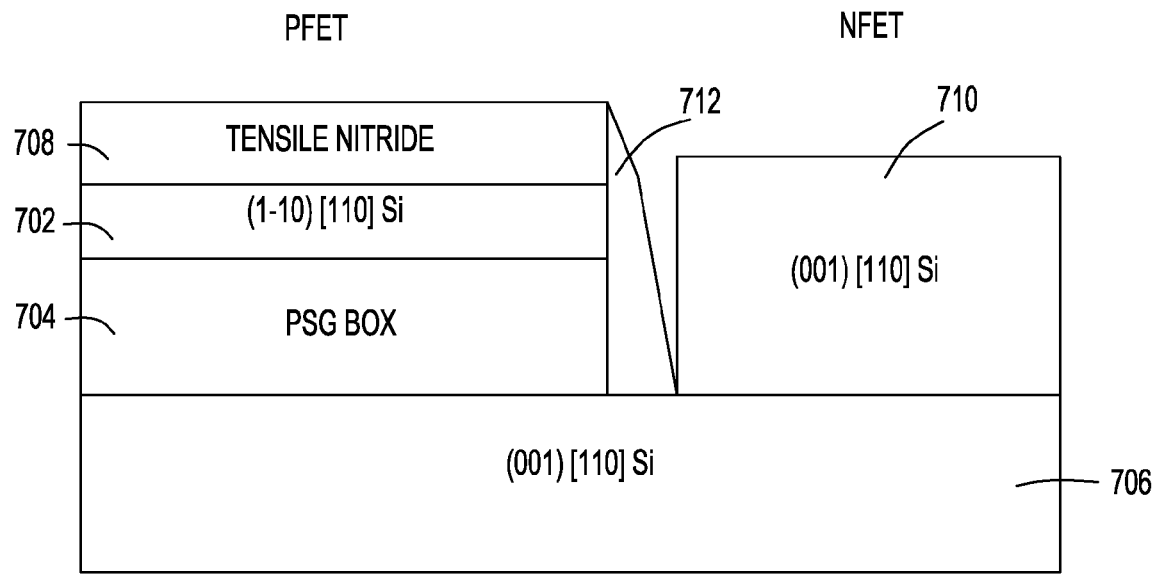

Thereafter, as illustrated in FIG. 27, the nitride stressor layer 708 serves as a hard mask when a portion of the stacked layers 708, 702, 704 are etched sufficiently to expose a surface of the underlying bulk silicon region 706. An epitaxial silicon layer 710 having the (001)[110] crystal orientation is then grown from the exposed bulk silicon surface, after forming an appropriate dielectric spacer 712 on a wall of the stacked layers 708, 702, 704.

Figure 28:
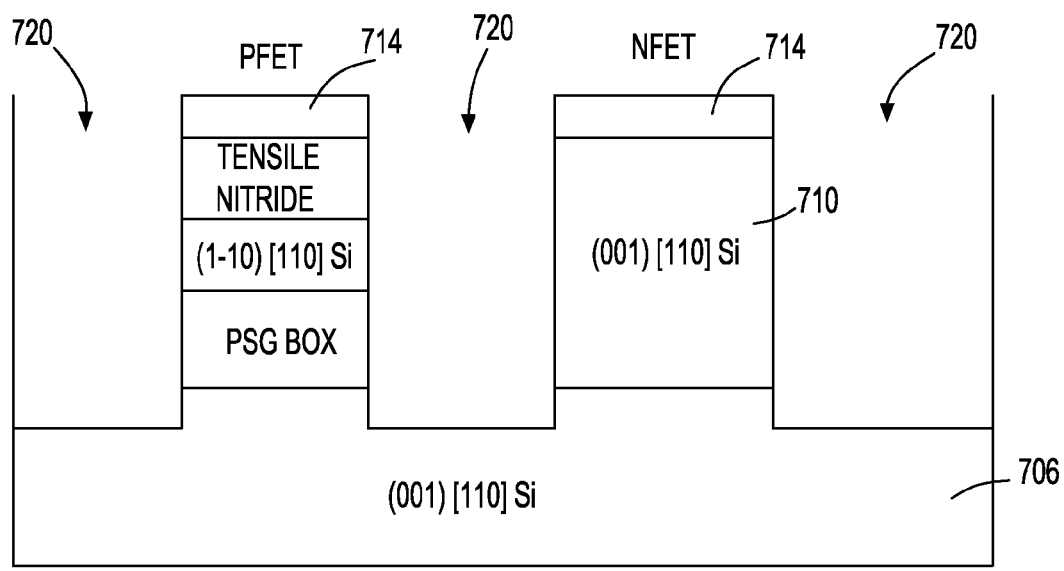
Figure 29:
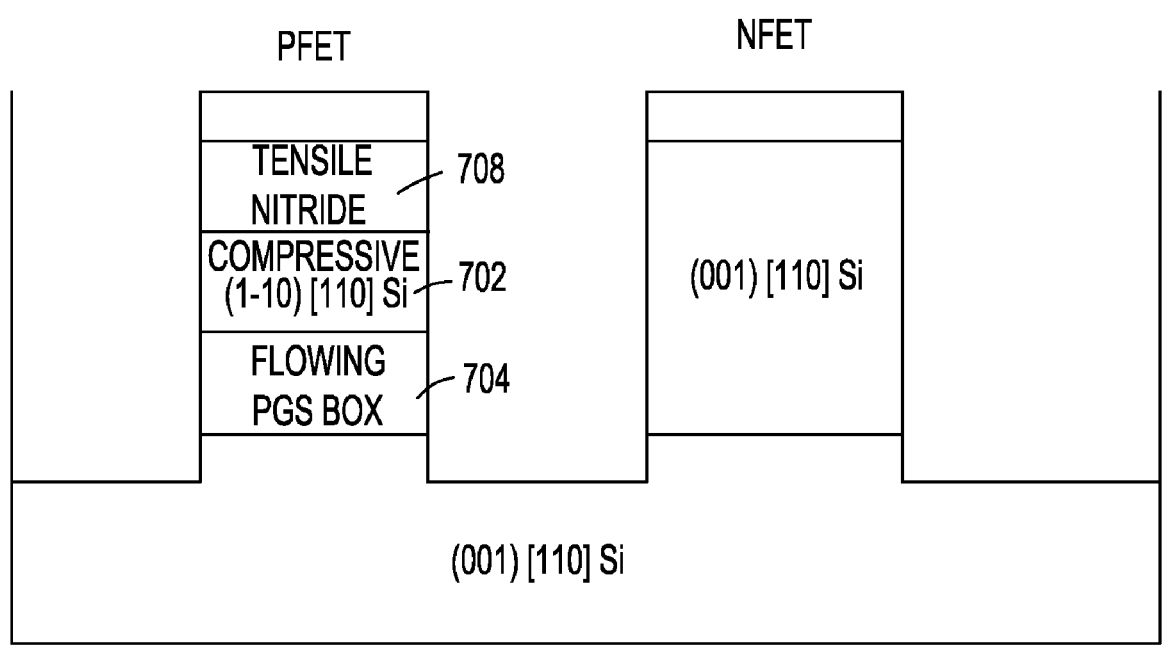

Next, as illustrated in FIG. 28, a hard mask layer 714 is then deposited to overlie the epitaxial silicon layer 710, after which trenches 720 are etched in the substrate 700 to a sufficient depth to expose the bulk silicon region 706. This step is then followed by heating the substrate to a temperature at which the PSG BOX layer 704 becomes flowable (FIG. 29). During this heating step, the SOI layer 702 acquires compressive stress as a result of its proximity to the tensile nitride stressor layer 708 overlying such layer.

Thereafter, FIG. 25 illustrates the SOI substrate 700 after forming trench isolation regions 622 by depositing an oxide, especially silicon oxide, to fill the trenches and removing the hard mask layer and nitride stressor layer in succession.

In view of the foregoing variations of embodiments of the invention shown and described herein, it will be understood that many modifications and enhancements can be made without departing from the true scope and spirit of the present invention. It is intended by the claims appended below to cover all such modifications and enhancements.

What is claimed is:

1. A method of fabricating a semiconductor-on-insulator ("SOI") substrate, comprising:

forming a SOI substrate including (i) an SOI layer of monocrystalline silicon separated from (ii) a bulk semiconductor layer by (iii) a buried oxide ("BOX") layer including a layer of doped silicate glass by steps including depositing the doped silicate glass layer onto a first wafer including a first semiconductor layer, bonding the doped silicate glass layer to a second wafer including a second semiconductor layer, and then removing a portion of one of the first and second semiconductor layers;

then depositing a sacrificial stressed layer onto the SOI substrate to overlie the SOI layer;

etching trenches through the sacrificial stressed layer and into the SOI layer;

then heating the SOI substrate with the sacrificial stressed layer to a temperature of about 600° C. to cause the doped silicate glass layer to soften and the sacrificial stressed layer to relax, to thereby apply a stress to the SOI layer to form a stressed SOI layer;

then filling the trenches in the stressed SOI layer with a dielectric material to form trench isolation regions contacting peripheral edges of the stressed SOI layer, the trench isolation regions extending downwardly from a major surface of the stressed SOI layer towards the BOX layer;

after the filling of the trenches, removing the sacrificial stressed layer to expose the stressed SOI layer; and then forming a transistor having an active semiconductor region disposed within the stressed SOI layer, wherein the stress in the stressed SOI layer remains essentially fixed despite thermal processing required to form the transistor.

2. The method of fabricating a SOI substrate as claimed in claim 1, wherein the stressed SOI layer includes at least one region having at least one of tensile stress or compressive stress.

3. The method of fabricating a SOI substrate as claimed in claim 1, wherein the sacrificial stressed layer includes silicon nitride.

4. The method of fabricating an SOI substrate as claimed in claim 1, wherein the SOI layer has a first crystal orientation and the bulk silicon layer has a second crystal orientation different from the first crystal orientation, the method further comprising, prior to the step of etching the trenches, patterning the sacrificial stressed layer, the SOI layer and the doped silicate glass layer to expose a portion of the bulk semiconductor layer, and epitaxially growing a monocrystalline silicon layer from the surface of the bulk semiconductor layer exposed within the opening, the epitaxial layer having the second crystal orientation, wherein the etching of the trenches includes etching trenches which separate the SOI layer from the epitaxial layer, such that after the filling of the trenches, the epitaxial layer has at least one peripheral edge laterally separated from the SOI layer by at least one of the trench isolation regions.

5. The method of fabricating an SOI substrate as claimed in claim 4, wherein the doped silicate glass is doped with phosphorus.

6. The method of fabricating an SOI substrate as claimed in claim 4, further comprising forming an n-type field effect transistor ("NFET") having a conduction channel disposed in the stressed SOI layer and forming a p-type field effect transistor ("PFET") having a conduction channel disposed in the epitaxial layer.

7. The method of fabricating an SOI substrate as claimed in claim 4, further comprising forming a p-type field effect transistor ("PFET") having a conduction channel disposed in the stressed SOI layer and forming an n-type field effect transistor ("NFET") having a conduction channel disposed in the epitaxial layer.

8. The method of fabricating a SOI substrate as claimed in claim 1, wherein the BOX layer includes borophosphosilicate glass ("BPSG").

9. A method of fabricating a field effect transistor ("FET") in accordance with the method of fabricating an SOI substrate as claimed in claim 1, wherein the transistor is an FET having a channel region in the stressed SOI layer.

10. The method of fabricating an FET as claimed in claim 9, further comprising depositing a stressed dielectric liner to overlie the FET, the stressed dielectric liner applying increased stress to the channel region of the FET.

11. The method of fabricating a SOI substrate as claimed in claim 1, wherein the step of depositing the sacrificial stressed layer includes depositing and patterning a first sacrificial stressed layer having one of a tensile stress or a compressive stress to overlie a first portion of the SOI layer, then depositing a second sacrificial stressed layer to overlie a second portion of the SOI layer other than the first portion, the second sacrificial stressed layer having one of a tensile stress or a compressive stress other than that of the first sacrificial stressed layer, such that said step of heating causes the one of the first and second portions of the SOI layer to become compressive stressed and causes the other of the first and second portions of the SOI layer to become tensile stressed.

12. A method of fabricating field effect transistors ("FETs") in accordance with the method of fabricating an SOI substrate as claimed in claim 11, the method further comprising forming a p-type FET ("PFET") having a channel region in the compressive stressed portion of the SOI layer and forming an n-type FET ("NFET") having a channel region in the tensile stressed portion of the SOI layer.

13. The method of fabricating FETs as claimed in claim 12, further comprising depositing a compressive stressed dielectric liner to overlie the PFET, the compressive stressed dielectric liner applying increased stress to the channel region of the PFET and depositing a tensile stressed dielectric liner to overlie the NFET, the tensile stressed dielectric liner applying increased stress to the channel region of the NFET.

14. The method of fabricating a SOI substrate as claimed in claim 11, wherein the first sacrificial stressed layer includes tensile stressed silicon nitride and the second sacrificial stressed layer includes compressive stressed silicon nitride.

15. A method of fabricating a semiconductor-on-insulator ("SOI") substrate, comprising:

forming a SOI substrate including (i) an SOI layer of monocrystalline silicon separated from (ii) a bulk semiconductor layer by (iii) a buried oxide ("BOX") layer including a layer of doped silicate glass by steps including depositing a doped silicate glass layer onto a first structure including a first semiconductor layer, bonding the doped silicate glass layer to a second structure including a second semiconductor layer and then removing a portion of one of the first and second semiconductor layers;

then forming a first sacrificial stressed layer having one of a tensile stress or a compressive stress to overlie a first portion of the SOI layer while exposing a second portion of the SOI layer;

forming a second sacrificial stressed layer having one of a tensile stress or a compressive stress other than that of the first sacrificial layer, such that the second sacrificial stressed layer contacts the first sacrificial stressed layer and the second portion of the SOI layer;

then at least substantially removing the second sacrificial stressed layer from atop the first sacrificial stressed layer;

then etching trenches through the first and second sacrificial stressed layers and into the SOI layer;

then heating the SOI substrate with the first and second sacrificial stressed layers thereon sufficiently to cause the doped silicate glass layer to soften and the first and second sacrificial stressed layers to relax, to thereby apply a stress to the first and second portions of the SOI layer to form first and second stressed portions of the SOI layer, the step of heating causing one of the first and second portions of the SOI layer to become compressive stressed and the other of the first and second portions of the SOI layer to become tensile stressed;

then filling the trenches in the stressed SOI layer with a dielectric material to form trench isolation regions contacting peripheral edges of the first and second stressed portions of the SOI layer, the trench isolation regions extending downwardly from a major surface of the SOI layer towards the BOX layer;

after the filling of the trenches, removing the first and second sacrificial stressed layers to expose the first and second stressed portions of the SOI layer; and then forming transistors having active semiconductor regions disposed within the first and second stressed portions of the SOI layer, wherein the stress in the first and second stressed portions remains essentially fixed despite thermal processing required to form the transistors.

16. The method of fabricating a SOI substrate as claimed in claim 15, wherein the sacrificial stressed layer includes silicon germanium and the BOX layer includes phosphosilicate glass ("PSG").

17. The method of fabricating a SOI substrate as claimed in claim 15, wherein the first sacrificial stressed layer includes tensile stressed silicon nitride, the second sacrificial stressed layer includes silicon germanium and the BOX layer includes phosphosilicate glass ("PSG").

18. The method of fabricating a SOI substrate as claimed in claim 15, wherein the BOX layer includes borophosphosilicate glass ("BPSG").

* * * * *